(12) United States Patent
Larsson

(10) Patent No.: US 10,594,255 B2
(45) Date of Patent: Mar. 17, 2020

(54) PHOTOVOLTAIC THERMAL HYBRID SOLAR COLLECTOR

(71) Applicant: Solarus Sunpower Sweden AB, Gävle (SE)

(72) Inventor: Stefan Larsson, Älvkarleby (SE)

(73) Assignee: SOLARUS SUNPOWER SWEDEN AB (SE)

(*) Notice: Subject to any disclaimer, the term of this patent is extended or adjusted under 35 U.S.C. 154(b) by 404 days.

(21) Appl. No.: 15/307,707

(22) PCT Filed: Apr. 20, 2015

(86) PCT No.: PCT/SE2015/050450
§ 371 (c)(1),
(2) Date: Oct. 28, 2016

(87) PCT Pub. No.: WO2015/167389
PCT Pub. Date: Nov. 5, 2015

(65) Prior Publication Data
US 2017/0054409 A1    Feb. 23, 2017

(30) Foreign Application Priority Data
Apr. 30, 2014  (SE) ..................... 1450519

(51) Int. Cl.
*H02S 40/44*  (2014.01)
*H01L 31/044*  (2014.01)
(Continued)

(52) U.S. Cl.
CPC ............... *H02S 40/44* (2014.12); *F28F 3/12* (2013.01); *H01L 31/044* (2014.12);
(Continued)

(58) Field of Classification Search
CPC .......... H01M 4/628; H01M 4/38; H01M 4/56; H01M 10/06; H01M 10/10
See application file for complete search history.

(56) References Cited

U.S. PATENT DOCUMENTS

2007/0272295 A1* 11/2007 Rubin ................. F28F 1/22
136/246
2009/0288705 A1* 11/2009 Hiwatashi ............. H01G 9/20
136/256
(Continued)

FOREIGN PATENT DOCUMENTS

CN    101719742 A    6/2010
CN    102460733 A    5/2012
(Continued)

OTHER PUBLICATIONS

Kern Hans-Juergen, EP-2141745-A2, English Machine Translation, Jan. 2010.*

(Continued)

*Primary Examiner* — Tae-Sik Kang
(74) *Attorney, Agent, or Firm* — Christopher & Weisberg, P.A.

(57) ABSTRACT

A laminated photovoltaic thermal (PV/T) module for a PV/T hybrid solar collector comprising a cooler/absorber and a photovoltaic unit. The cooler/absorber includes at least one flat surface with raised peripheral edges and is adapted to function as a mould for a photovoltaic laminate structure. The photovoltaic unit includes a photovoltaic laminate structure including: a first layer of a first laminate material moulded on the flat surface of the cooler/absorber, wherein the first laminate material is electrically insulating and has a high thermal conductivity; a plurality of photovoltaic cells positioned on the first layer of laminate material; and a second layer of a second laminate material moulded on and (Continued)

substantially covering the photovoltaic cells, wherein the second laminate material is transparent and has a high heat resistance.

17 Claims, 4 Drawing Sheets

(51) Int. Cl.
 H01L 35/32 (2006.01)
 H01L 31/048 (2014.01)
 H02S 40/42 (2014.01)
 F28F 3/12 (2006.01)
 H01L 31/05 (2014.01)
 F24S 25/40 (2018.01)

(52) U.S. Cl.
 CPC ........ *H01L 31/048* (2013.01); *H01L 31/0504* (2013.01); *H01L 35/32* (2013.01); *H02S 40/425* (2014.12); *F24S 25/40* (2018.05); *F28F 2255/14* (2013.01); *Y02E 10/50* (2013.01); *Y02E 10/60* (2013.01)

(56) References Cited

U.S. PATENT DOCUMENTS

| | | | |
|---|---|---|---|
| 2010/0229915 A1* | 9/2010 | Ledenev | H02J 3/385 136/244 |
| 2011/0186109 A1 | 8/2011 | Elazari | |
| 2011/0217856 A1* | 9/2011 | Vijh | H01R 13/5205 439/76.1 |
| 2012/0318318 A1* | 12/2012 | Metin | H01L 31/0504 136/244 |
| 2014/0109952 A1 | 4/2014 | Jang et al. | |

FOREIGN PATENT DOCUMENTS

| | | | |
|---|---|---|---|
| CN | 202364144 U | * 8/2012 | |
| CN | 102844889 A | 12/2012 | |
| CN | 102969380 A | 3/2013 | |
| CN | 203165907 U | 8/2013 | |
| DE | 27 30 078 A1 | 3/1979 | |
| DE | 44 24 801 A1 | 1/1996 | |
| DE | 10 2007 038 240.7 A1 | 2/2009 | |
| DE | 10 2008 027 000.8 A1 | 12/2009 | |
| EP | 0 981 167 A2 | 2/2000 | |
| EP | 2 141 745 A2 | 1/2010 | |
| EP | 2141745 A2 * | 1/2010 | ............... F24J 2/515 |
| EP | 2141745 A2 | 1/2010 | |
| GB | 2471844 A1 | 1/2011 | |
| WO | 2012045842 A1 | 4/2012 | |

OTHER PUBLICATIONS

Jianduo Li, CN-202364144-U, English Machine Translation, Aug. 2012.*
International Search Report and Written Opinion dated Jul. 20, 2015 for International Application Serial No. PCT/SE2015/050450, International Filing Date: Apr. 20, 2015 consisting of 11-pages.
Chinese Office Action and Translation dated Aug. 24, 2017 for Chinese Application No. 201580021501.0, Application Filing Date: Apr. 20, 2015, consisting of 19-pages.
Chinese Office Action and Translation dated Jan. 17, 2018 for Chinese Application No. 201580021501.0, Application Filing Date: Apr. 20, 2015, consisting of 19-pages.
Indian Examination Report, dated Dec. 6, 2019, for Application No. 201627037138, consisting of 5 pages.

* cited by examiner

PHOTOVOLTAIC THERMAL HYBRID SOLAR COLLECTOR

CROSS-REFERENCE TO RELATED APPLICATIONS

This application is a Submission Under 35 U.S.C. § 371 for U.S. National Stage Patent Application of International Application Number: PCT/SE2015/050450, filed Apr. 20, 2015, entitled "PHOTOVOLTAIC THERMAL HYBRID SOLAR COLLECTOR," which claims priority to Swedish Application No.: 1450519-2, filed Apr. 30, 2014, entitled "PHOTOVOLTAIC THERMAL HYBRID SOLAR COLLECTOR," the entirety of both which are incorporated herein by reference.

FIELD OF THE INVENTION

The present invention relates to a laminated photovoltaic thermal (PV/T) module for a photovoltaic thermal hybrid solar collector, a PV/T hybrid solar collector comprising such a laminated PV/T module and a method for manufacturing such a laminated PV/T module.

TECHNICAL BACKGROUND

There exist a number of PV/T hybrid solar collector systems using PV/T modules to convert solar energy into electrical energy. The efficiency of the solar cells or photovoltaic cells keeps improving whereas costs continue to reduce, thus making solar energy an important and viable source of renewable and environment friendly energy.

Conventional PV/T modules are manufactured by encapsulating solar cells, which are very brittle, in a laminate structure to protect them from optical and mechanical damage due to continuous exposure to sunlight and the weather elements. Additionally, PV/T modules comprise a cooling/absorbing element containing fluid for carrying away the heat accumulated in the solar cells which affects the performance of the solar cell. However, in order to reach efficiency in a PV/T hybrid solar collector it is necessary to reach a certain minimum temperature of the cooling/absorbent fluid whilst at the same time the voltage output of the photovoltaic cells decreases with increasing temperature. This dual functionality places strict requirements on the materials used in the PV/T module.

Examples of such PV/T modules are disclosed in EP 2 405 489, DE 198 09 883 and WO 2011/146029, which are incorporated herein by reference. These known PV/T modules are typically manufactured with laminate layers of polymer films comprising e.g. ethylene vinyl acetate (EVA), fluoropolymers such as polyvinyl fluoride (PVF) or polyvinyl butyral (PVB) and/or silicone polymers. The polymer films are cut and placed such that the solar cells are sandwiched between two polymer layers of EVA, PVF and/or PVB and subsequently the layers are laminated together in vacuum at an appropriate temperature. The laminated solar cell structure is then afterwards integrated with the cooling/absorbing element in the form of a heat transfer plate or heat exchanger having tubes for passage of a cooling fluid.

However, because of the considerable temperature gradients across the PV/T module, especially in coolers having fluid channels interspaced by flanges such as DE 198 09 883 and WO 2011/146029, the thermal expansion experienced by the cooler and the solar cells varies and may cause damage to the solar cells and the laminate layers made from polymer films, such as deformation, cracking, delamination, separation from the cooling element etc. and also limit the efficiency of the solar cells.

Hence, there is a need to develop improved PV/T modules and manufacturing methods therefor.

SUMMARY OF THE INVENTION

The object of the present invention is to provide improved PV/T modules for PV/T hybrid solar collectors and manufacturing methods therefor.

This is achieved by a laminated photovoltaic thermal (PV/T) module for a photovoltaic thermal hybrid solar collector according to claim 1, comprising a cooler/absorber and a photovoltaic unit. The cooler/absorber comprises at least one flat surface with raised peripheral edges and adapted to function as a mould for a photovoltaic laminate structure. The photovoltaic unit comprises a photovoltaic laminate structure including: a first layer of a first laminate material moulded on the flat surface of the cooler/absorber, wherein the first laminate material is electrically insulating and has a high thermal conductivity; a plurality of photovoltaic cells positioned on the at least partially cured first layer of laminate material; and a second layer of a second laminate material moulded on and substantially covering the photovoltaic cells, wherein the second laminate material is transparent and has a high heat resistance, preferably up to a temperature of at least 200° C. The two layers of laminate may be of the same or of different materials.

By providing a cooler/absorber with raised peripheral edges a functional mould (a 'bath tub') is formed which may be used to mould a photovoltaic laminate structure using liquid laminate material through a potting process. The laminate structure thus achieved provides greater protection against damage caused by thermal expansion since the layers formed from the liquid laminate material may be applied more uniformly on the surface of the cooler/absorber and the photovoltaic cells and also provide better adhesion to each other and covering of the photovoltaic cells. Another advantage is that the photovoltaic laminate structure may be formed directly on the cooler/absorber as opposed to conventional PV/T modules wherein the laminate structure is formed separately and subsequently joined or attached to the cooling element. It has also been found that the photovoltaic laminate structure formed in accordance with the present invention provides better protection against disruptive discharge in wet conditions.

In a preferred embodiment, the PV/T module further comprises a second photovoltaic laminate structure moulded on an opposite substantially identical flat surface of the cooler/absorber, wherein the first and second photovoltaic laminate structures are substantially identical. Such a double-sided PV/T module may be used with a solar reflector in order to direct sunlight onto both sides of the PV/T module to increase the efficiency.

In an alternative embodiment, the cooler/absorber and the first laminate material comprise a transparent material such that both the front and back side of the photovoltaic cells may be illuminated by sunlight. Preferably, the transparent material comprises polyurethane or other material which is heat resistant in the range of 100-200° C. and is resistant to ultraviolet radiation above 1000 W/m². Since the sunlight is permitted to illuminate the photovoltaic cells from both the front and back sides, the total concentration factor for the PV/T module is doubled compared with the case using two strings of photovoltaic cells on opposite sides.

In a further preferred embodiment, the first and/or second laminate material comprises siloxane or polyurethane.

Siloxanes are organosilicon compounds with elastomeric properties which provide necessary mechanical protection of the photovoltaic cells to shocks or vibration as well as ensuring excellent adhesion between the laminate layers. One example is polydimethylsiloxane (PDMS), which in liquid form is viscoelastic, meaning that at long flow times it acts like a viscous liquid to cover a surface and mould to any surface imperfections. Siloxanes also offer excellent heat resistance, up to 200° C., whilst allowing high thermal conduction as well as being electrically insulating. Compounds containing siloxane may be made transparent to optical and/or ultraviolet radiation. Furthermore, siloxane-containing compounds used in the photovoltaic laminate structure according to the present invention are cheaper and more weather resistant than conventional materials used in photovoltaic applications, such as EVA, PVF and PTFE. In highly accelerated stress tests (HAST), the photovoltaic laminate structure according to the present invention remained intact up to 300 hours, compared to 30 minutes for conventional laminate structures.

It has been found that similar laminate properties may be achieved by compounds containing polyurethane (PU).

In a preferred embodiment, the PV/T module further comprises a watertight flexible external electrical connection to the photovoltaic cells. The external electrical connections can be sheathed in a compatible material such as a silicon-based heat-shrink tubing to prevent ingress of moisture along the connection through the laminate. Such a connection may be made through a flexible coupling or flexible wire, e.g. a braided copper wire.

In an advantageous embodiment, the photovoltaic cells are arranged in strings of photovoltaic cells and the PV/T module further comprises a bypass diode connected in parallel with each string of photovoltaic cells. The bypass diodes may also be moulded into the photovoltaic laminate structure. Preferably, the bypass diodes further comprise DC/DC converters, which also may be moulded into the photovoltaic laminate structure. During morning/evening when the sun is low, the PV/T module is usually partially shaded since the sunlight reaches the module at low angles. The resulting low light intensity turns off the effect of practically all the photovoltaic cells in the module. The bypass diodes minimise the effects of shading such that the PV/T module only loses the power of the shaded strings of photovoltaic cells. Moreover, in the case where the bypass diodes and the DC/DC converters are moulded into the photovoltaic laminate structure, they will be protected and experience cooling at the same level as the photovoltaic cells.

In another preferred embodiment, the strings of photovoltaic cells are connected in series to form at least one series circuit. Preferably, the strings of photovoltaic cells are connected to form at least two series circuits connected in parallel. This parallel connection of the strings of photovoltaic cells makes it possible to reduce the partial shading to below 50% of the aperture surface of the PV/T module, i.e. at least 50% of the PV/T module is operational, for increased efficiency in shaded conditions. The shading effect decreases with increasing number of strings and parallel circuits, thus ensuring that the performance of the PV/T module is maintained at a high level.

In an alternative embodiment, the cooler/absorber comprises a plurality of longitudinal fluid channels adapted to give an evenly distributed flow of fluid. Preferably, the fluid channels have a substantially elliptic or circular cross-sectional shape. Tests have shown that by adapting the cross-sectional shape and size of the fluid channels, it is possible to achieve an evenly distributed flow of fluid which gives excellent cooling effect and near isothermal temperature distribution across the cooler/absorber.

In a preferred embodiment, the fluid channels comprise a honeycomb or rhombic structure on the surface which facilitates longitudinal movement of the fluid in the fluid channels. Preferably, the system of fluid channels is created by extrusion of a metal alloy, such as aluminium or similar, or a polymer, preferably polyurethane (PU), and the fluid channels are adapted to tolerate hydraulic pressures in the range 1-25 bar.

In an advantageous embodiment, the PV/T module further comprises at least one pipe connector having a first distribution section connected to the fluid channels of the cooler/absorber and a second section with an adaptable inlet opening in fluid communication with the first section. The distribution section may possess a plurality of openings adapted for connection to the fluid channels. The pipe connector may be made from moulding of metal or polymer material and is adapted to evenly distribute the flow of fluid into and out of the fluid channels through pressure drop or decompression distribution. The inlet opening may be in the form of a nozzle with inwardly projecting flanges which may be milled down to desired size and shape to regulate or equalise fluid flow.

In a preferred embodiment, the pipe connector is designed such that it may be connected to a fluid hose/pipe with a quick-connect function, e.g. for trapezoid-shaped metal hoses or pipe parts with O-ring sealing, or another quick-connect methodology.

In a second aspect of the present invention, there is provided a method for manufacturing a laminated PV/T module for a PV/T hybrid solar collector, comprising the steps:

providing a cooler/absorber having at least one flat surface with raised peripheral edges and adapted to function as a mould for a photovoltaic laminate structure;

pouring a first layer of a first laminate material in liquid form onto the flat surface of the cooler/absorber, wherein the first laminate material is electrically insulating and has a high thermal conductivity;

at least partially curing the first layer of the first laminate material;

positioning a plurality of photovoltaic cells on the at least partially cured first layer of laminate material;

pouring a second layer of a second laminate material in liquid form onto the photovoltaic cells such that they are substantially covered by the second laminate material, wherein the second laminate material is transparent and has a high heat resistance;

curing the second layer of the second laminate material and the at least partially cured first layer of the first laminate material.

In a preferred embodiment, the method further comprises the steps of moulding a second photovoltaic laminate structure onto an opposite substantially identical flat surface of the cooler/absorber, wherein the first and second photovoltaic laminate structures are substantially identical.

In an alternative embodiment, the cooler/absorber and the first laminate material comprise a transparent material such that both the front and back side of the photovoltaic cells may be illuminated by sunlight. Preferably, the first and/or second laminate material comprises siloxane or polyurethane.

In an advantageous embodiment, the method further comprises arranging the photovoltaic cells in strings and connecting a bypass diode in parallel with each string of photovoltaic cells before pouring of the second layer of the second laminate material.

In a preferred embodiment, the method further comprises providing a DC/DC converter in conjunction with the bypass diode before pouring of the second layer of the second laminate material.

In an alternative embodiment, the method further comprises connecting the strings of photovoltaic cells in series to form at least one series circuit.

In an advantageous embodiment, the method further comprises connecting the strings of photovoltaic cells to form at least two series circuits connected in parallel.

In an alternative embodiment, the method further comprises providing a watertight flexible electrical connection including a sheath chemically compatible with the laminate material to the photovoltaic cells in order to prevent ingress of moisture along the connection through the laminate.

In a preferred embodiment, the method further comprises wetting the sheath of the electrical connection with the second laminate material thereby creating a watertight joint. The step of wetting the electrical connection ensures a tight bond between the electrical connection and the laminate which is resistant to moderate relative movement.

In an advantageous embodiment, the cooler/absorber comprises a plurality of longitudinal fluid channels adapted to give an evenly distributed flow of fluid, the method further comprising directing a heated fluid through the fluid channels in order to cure the first and/or second laminate material.

In an alternative embodiment, the fluid channels have a substantially elliptic or circular cross-sectional shape. Preferably, the fluid channels comprise a honeycomb or rhombic structure on the surface. The shape and surface structure of the fluid channels are adapted to optimise distribution of fluid to give an evenly distributed fluid flow.

In a preferred embodiment, the fluid channels are formed by extrusion of a metal alloy, preferably aluminium, or a polymer, preferably polyurethane (PU). By extrusion it is possible to create fluid channels of any desired cross-section with an excellent surface finish.

In an advantageous embodiment, the method further comprises accelerating the curing process by subjecting the laminate to UV light, infrared heat, humidity and/or by adding a catalyst. Alternatively, the curing process may be allowed to take its time by letting the laminate material sit without external influence.

In an alternative embodiment, the method further comprises providing at least one pipe connector having a first distribution section with a plurality of openings adapted to be connected to the fluid channels and a second section with an adaptable inlet opening in fluid communication with the first section.

In a preferred embodiment, the method further comprises arranging a transparent convection barrier above the photovoltaic cells.

DETAILED DESCRIPTION OF THE INVENTION

Below, the laminated PV/T module 10 and the method of manufacturing thereof will be described more in detail, reference being made to the figures. However, the invention should not be considered limited to the embodiment or embodiments shown in the figures and described below, but may be varied within the scope of the claims.

Figure 1:
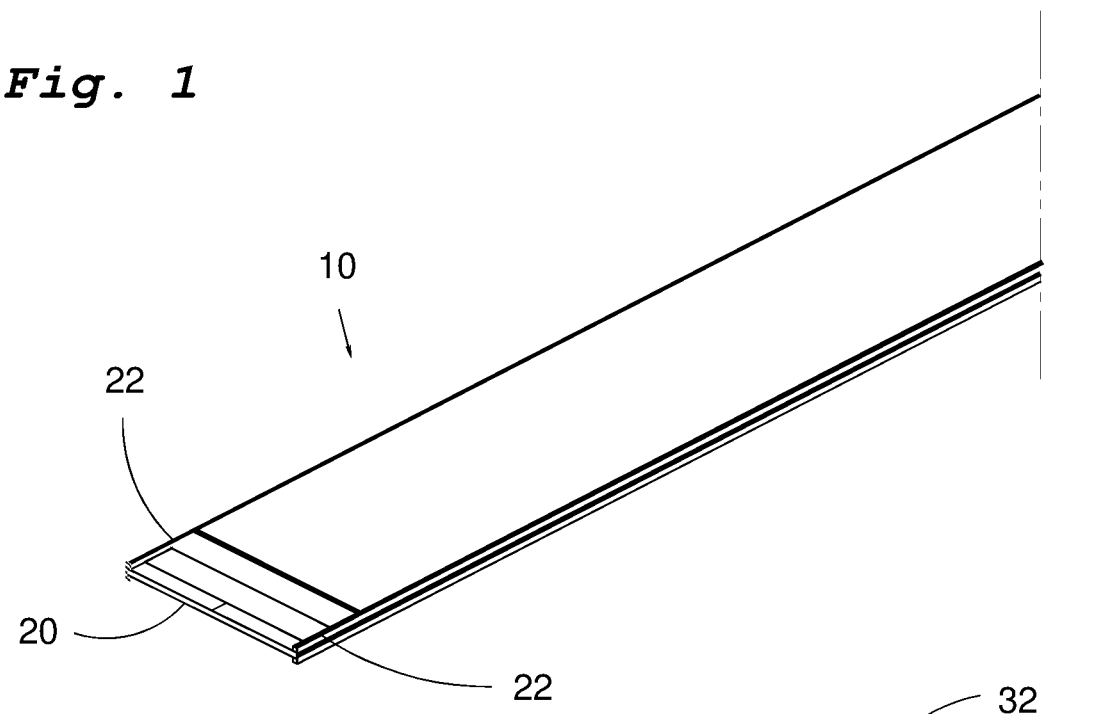
FIG. 1 shows an elevated side view of a laminated photovoltaic thermal (PV/T) module according to the present invention
Figure 2:
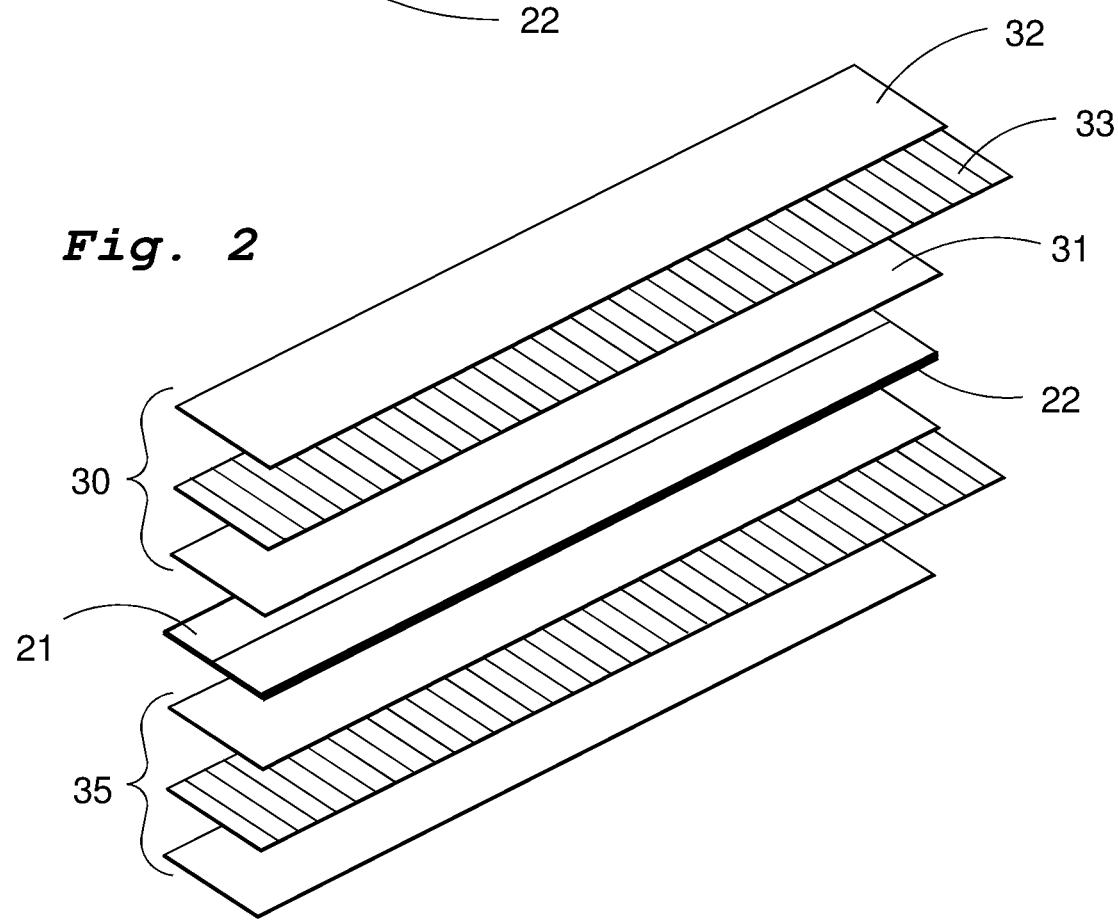
FIG. 2 shows an exploded view of a laminated PV/T module according to the present invention.

In FIG. 1, there is shown a laminated PV/T module 10 according to the present invention in an elevated side view. FIG. 2 shows the separate laminate layers 31, 32 and the photovoltaic cells 33 in an exploded view for easier understanding of the invention. The PV/T module 10 comprises a cooler/absorber 20 and a photovoltaic unit 30 having a plurality of photovoltaic or solar cells 33 encapsulated in a laminate structure for protection. The advantages with the PV/T module 10 will now be explained.

Contrary to conventional PV/T modules having laminated solar cells, the present invention discloses a construction wherein the photovoltaic laminate structure 30 is produced or manufactured directly on the surface 21 of the cooler/absorber 20, instead of being produced separately and later joined or integrated with the cooler/absorber 20.

As seen in FIG. 2, the cooler/absorber 20 has raised edges 22 at least along the longitudinal sides thereof resulting in a functional mould. The raised edges 22 create an enclosure allowing liquid to be contained therein, which is advantageous when pouring and moulding the laminate layers 31, 32. The cooler/absorber 20 is shown to have raised peripheral edges 22 on both sides, the top side and underside. This is to allow for moulding of photovoltaic laminate structures 30, 35 both on the top side and the underside to increase efficiency and use of space.

Positioned nearest to the flat top surface 21 of the cooler/absorber 20 is an electrically insulating first layer 31 of a first laminate material which has been moulded in liquid form and subsequently at least partially cured by application of heat. The first laminate layer 31 is 0.2 to 2 mm thick and has a high thermal conductivity, in the range of 0.1-10 $Wm^{-1}K^{-1}$ to carry away heat generated in the photovoltaic cells 33. This is to ensure that the photovoltaic cells 33 do not exceed their stagnation temperature, which can cause efficiency reduction. The first laminate material is adapted to be heat resistant to temperatures above 150° C., preferably at least 200° C. The required insulation effect provided by the first laminate layer 31 is at least 10 GΩ at 5 kV. The dielectric strength is at least 18 kV/mm.

Next in the direction from the surface 21 of the cooler/absorber 20 there is positioned on top of the electrically insulating first laminate layer 31 a plurality of photovoltaic cells 33 in strings, and additional wiring necessary to create the electrical circuits and connections. Any commercially available photovoltaic cells 33 with high efficiency and short distance between the contact fingers may be used. As an example, it is suggested to use photovoltaic cells from Hitachi with high fill factor and transparent front side contact. The PV/T module 10 may have at least 2 strings of photovoltaic cells 33, each string 36 comprising a number of photovoltaic cells 33 to attain sufficient output voltage, typically 34 photovoltaic cells or more. The photovoltaic cells 33 are shaped like thin strips and placed perpendicular to the longitudinal direction of the cooler/absorber 20 with a length adapted to the width of the cooler/absorber 20. This leads to a highly reduced thermal load on the photovoltaic cells 33 and helps avoid damage. In one embodiment, the width of the photovoltaic cells 33 is 26.6 mm.

Figure 8:
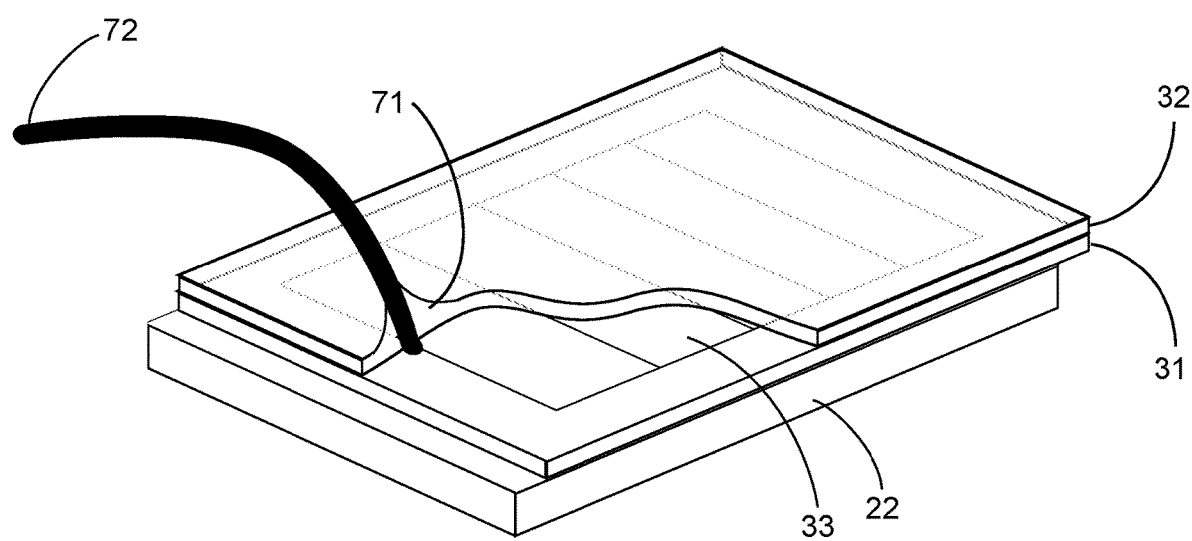
FIG. 8 shows a flexible wire connected to the photovoltaic cells according to an embodiment of the present invention.

The wires running the length of the cooler/absorber 20 are provided with a stress-relief jog in the centre of their span. This protects the electrical system against strain caused by longitudinal expansion of the cooler/absorber 20. The external electrical connections to the photovoltaic cells are made with a flexible electrical wire 72, as shown in FIG. 8, and sheathed with an insulating sleeve or sheath (not shown). In a preferred embodiment, this flexible electrical wire 72 is of braided tinned copper wire, and the sheath is of a silicone-based heat-shrink tube compatible with the laminate material to promote chemical bonding between the sheath and the laminate material and thereby create a watertight joint 71 around the connection point between the flexible electrical wire 72 and the photovoltaic cells 33. However the particular materials are not significant; it is proposed within the scope of this invention to use a flexible electrical wire with any sheath material chemically compatible with the chosen laminate.

Finally, furthest away from the surface 21 of the cooler/absorber 20 there is provided a second covering layer 32 of a transparent second laminate material to cover and protect the photovoltaic cells 33. The covering layer 32 is poured and moulded on top of the photovoltaic cells 33 and has the advantage of filling in small recesses between and around the photovoltaic cells 33 to give a substantially plane and uniform top layer contrary to the case with laminate structures created from polymer films stretching over the solar cells. Furthermore, the covering layer 32 is heat resistant to a temperature of at least 200° C.

The materials chosen for the first and second laminate layers 31, 32 preferably comprise siloxanes and/or polyurethane (PU). Siloxanes are a functional group in organosilicon chemistry with an Si—O—Si linkage, i.e. each pair of silicon centres is separated by one oxygen atom. The siloxane-containing compounds tested and used in the present invention, although being an organic material, does not act as such. Firstly, siloxane-containing laminate layers exhibit negligible reactions after prolonged exposure to ultraviolet radiation, as opposed to conventional EVA laminates, which start to dry and turn yellow. Siloxane-containing laminates have a higher transmittance within the spectrum of relevant wavelengths, roughly 93-96% transmittance from about 300 nm to about 1200 nm, and no considerable dips or spikes, as opposed to EVA, which has a transmittance of about 90% and considerable dips when nearing the infrared region. The proposed siloxane-containing compounds have a short curing time, when heated or exposed to UV light to trigger the chemical curing process. Finally, siloxane-containing compounds exhibit high electrical resistance, $2 \times 10^{15} \Omega$, and dielectric strength, 18.3 kV/mm.

Figure 3:
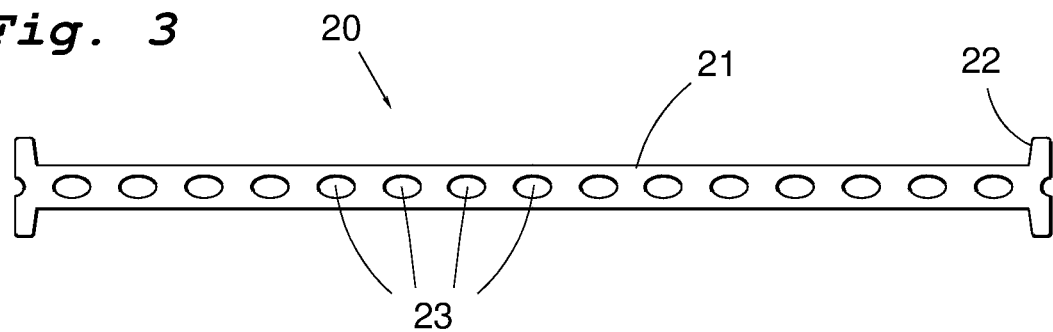
FIG. 3 shows a cross-sectional view of a cooler/absorber according to an embodiment of the present invention.

In FIG. 3, a cooler/absorber 20 according to an embodiment of the present invention is illustrated in cross-section. The peripheral side edges 22 are shown as well as the system of fluid channels 23 formed in the cooler/absorber 20. The cross-sectional shape of the fluid channels 23 has been adapted to give an evenly distributed fluid dynamic flow through the fluid channels 23. Tests have shown that in order to achieve optimal cooling/absorption of heat from the photovoltaic cells 33, the fluid channels 23 should have a substantially elliptic cross-section giving excellent cooling characteristics and close to isothermal surface temperatures. As opposed to fluid channels 23 with rectangular or quadratic cross-section, there is no movement or deformation observed of the cooler/absorber 20 at the high hydraulic pressure of the cooling/absorbent fluid used in the PV/T hybrid application. Therefore, there is no mechanical stress propagated to the photovoltaic cells 33, which otherwise would cause considerable damage. Circular cross-sections also protect against deformation of the cooler/absorber 20. However, an elliptic cross-section is preferred since this shape enables thinner coolers/absorbers with equal cross-sectional area compared to circular fluid channels 23, thus requiring less material. Thereby, the temperature gradient across the PV/T module 10 is minimised which reduces thermal load and stress on the photovoltaic cells 33 and allows the photovoltaic cells 33 to operate at ideal conditions at full efficiency.

The surface of the fluid channels 23 may be shaped in order to optimise fluid flow and heat transfer, e.g. by providing a honeycomb or rhombic structure. This surface structure may then be coated with a suitable material to reduce friction, such as polytetrafluoroethylene (PTFE).

Since the pressure of the fluid passing through the fluid channels 23 may be elevated, the fluid channels 23 are adapted to withstand a hydraulic pressure of between 1 and 25 bar.

The cooler/absorber 20 including the system of fluid channels 23 is created through extrusion of a metal alloy, e.g. aluminium, or a polymer, e.g. polyurethane (PU), in applications where the cooler/absorber 20 is made transparent for double sided illumination by sunlight.

Figure 4:
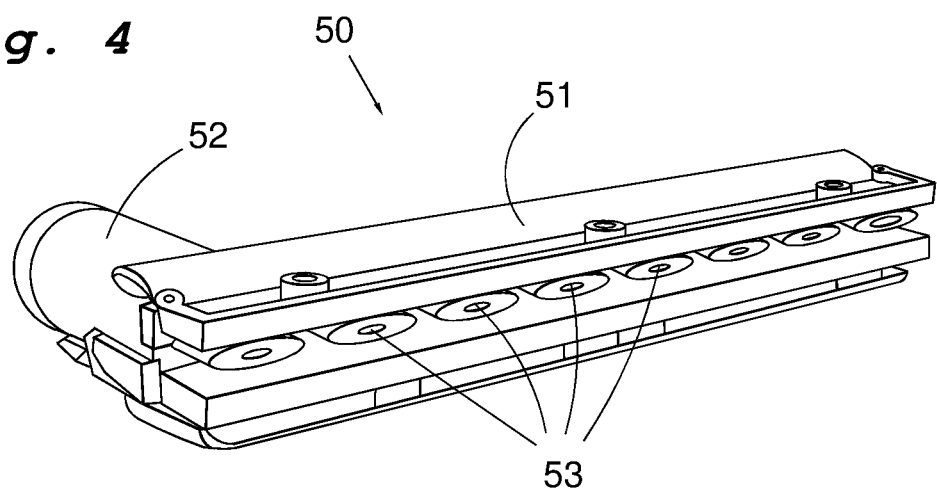
FIG. 4 shows a perspective view of a pipe connector according to an embodiment of the present invention.

In order to connect the PV/T module 10 to a closed or open loop of cooling/absorbent fluid, there is provided a pipe connector 50 adapted to be attached to the end surfaces of the cooler/absorber 20. The pipe connector 50 as illustrated in FIG. 4 comprises a distribution section 51 having substantially the same width as the cooler/absorber 20 and a plurality of openings 53 adapted to the fluid channels 23. The fluid flow through the distribution section 51 is evenly distributed through pressure drop or decompression distribution.

In fluid communication with the distribution section 51 is a second inlet/outlet section 52 which may have an adaptable inlet/outlet opening 54 to regulate or equalise the fluid flow there through. The inlet/outlet opening 54 may take the form of a nozzle having inwardly projecting flanges 55 which may be milled down to the desired dimension, or may also take the form of mechanical modifications to the shape of the end of the PV/T module 10.

Figure 5:
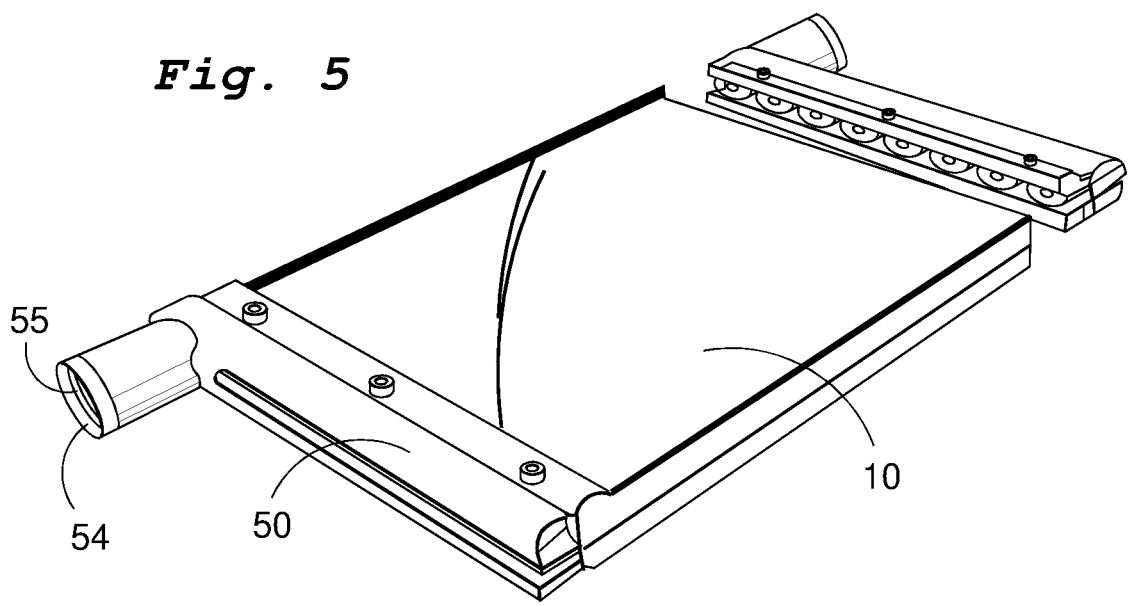
FIG. 5 shows a perspective view of a PV/T module according to the present invention including pipe connectors.

FIG. 5 shows the PV/T module 10 connected at its end sections to pipe connectors 50. The inlet/outlet opening 54 may be seen, as well as the flanges 55.

The pipe connector 50 is designed to be attached to fluid pipes or hoses through a quick-connect function, e.g. trapezoid-shaped metal hoses or pipe details for quick connection with an O-ring sealing, as is known in the art.

Figure 6:
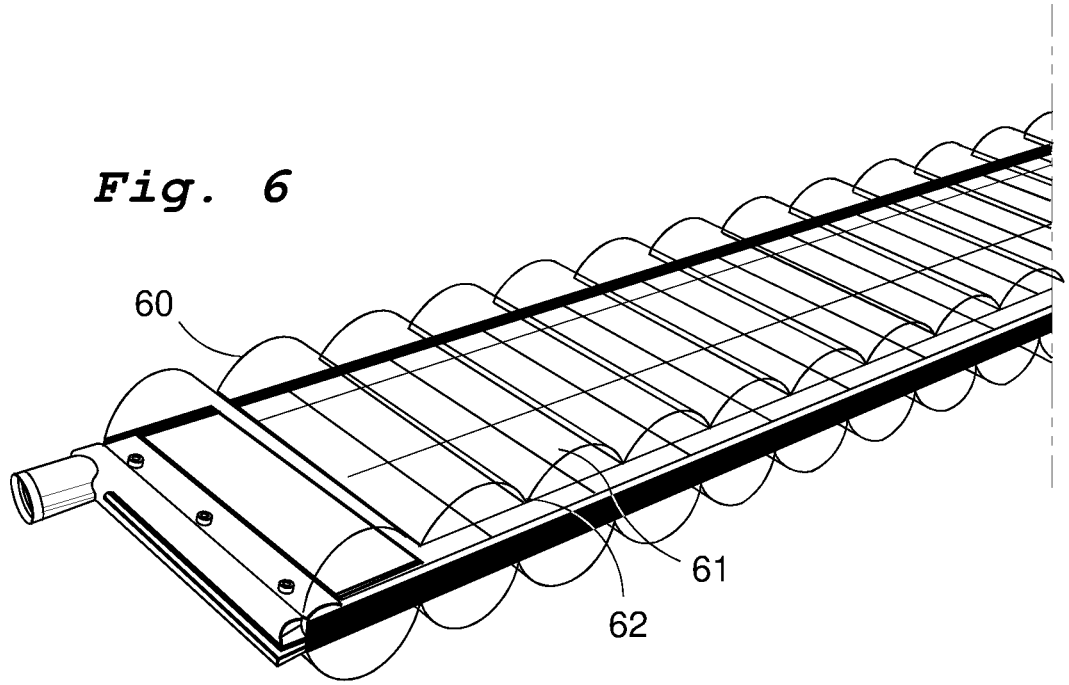
FIG. 6 shows a PV/T module including a convection barrier according to an embodiment of the present invention.

In FIG. 6 there is shown a transparent convection barrier 60 arranged above the PV/T module 10. The convection barrier 60 is shaped with a plurality of partially cylindrical elements or half-tubes 61 arranged perpendicular to the longitudinal direction of the PV/T module 10. The partially cylindrical elements 61 are connected along their respective valley regions 62. The purpose of the convection barrier 60 is to reduce convective thermal losses from the cooler/absorber at high temperatures such that the heat is transferred to the cooling/absorbent fluid instead of the air in the hybrid solar collector. The convection barrier 60 is adapted to be attached to the edge profile of the cooler/absorber 20, e.g. in a groove, above the photovoltaic laminate structure 30.

Figure 7:
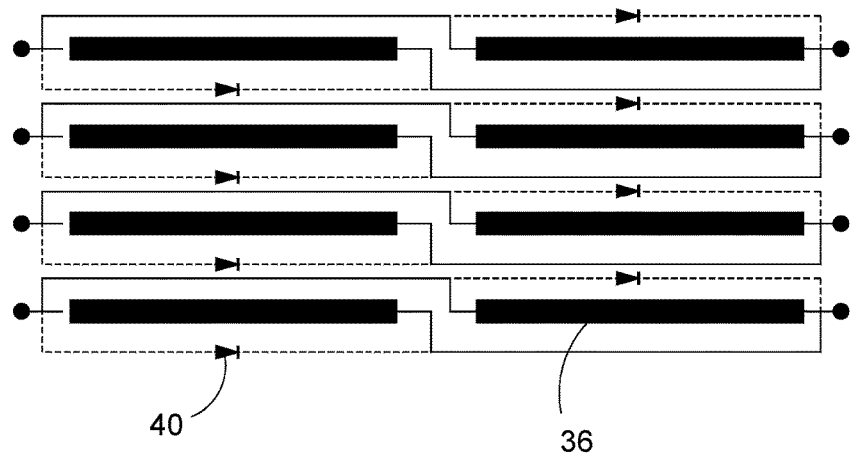
FIG. 7 shows a connection diagram of strings of photovoltaic cells according to an embodiment of the present invention.

In FIG. 7 a connection diagram for the strings 36 of photovoltaic cells 33 is shown. The PV/T module 10 shown has 8 cell strings 36 with 38 photovoltaic cells each, internally connected in parallel. Each string section 36 has a bypass diode 40 located in the end sections of the PV/T module 10. Each photovoltaic cell is connected by means of soldering at two spots on the top or bottom side, respectively, thereby relieving all stress on the photovoltaic cells 33.

Now, the lamination procedure will be described in further detail. Contrary to conventional lamination using polymer films, the present invention relies on potting to encapsulate the photovoltaic cells 33 and create a protective laminate structure 30. In the potting procedure the photovoltaic assembly is filled with a solid or gelatinous compound for resistance to shock and vibration, and for exclusion of moisture and corrosive agents.

First, the cooler/absorber 20 is prepared for lamination by subjecting the flat surface 21 to be coated to cleaning with a damp wipe of a solvent such as isopropanol or ultrasonic cleaning in order to remove any foreign particles, and subsequently priming the flat surface 21 through applying a coating of a primer solution suitable for the laminate material, e.g. propanol with optional additives, or through plasma treatment of the flat surface 21. The cooler/absorber 20 is allowed to cool to the ambient temperature, preferably below 30° C.

Now, the first layer 31 of the first laminate material is formed on the pretreated surface 21 of the cooler/absorber 20 by pouring an electrically insulating polymer material in liquid form onto the surface 21. The peripheral edges 22 of the cooler/absorber 20 retain the liquid first laminate material in the mould thus created to give an electrically insulating layer 31 of uniform thickness in the range of 0.2 to 2 mm. Since the first layer 31 is also intended to carry away heat from the photovoltaic cells 33, it is desirable to use a material which has a high thermal conductivity, preferably in the range of 0.1-10 $Wm^{-1}K^{-1}$. Preferably, the first laminate material comprises a siloxane in liquid form. A protective lid is placed above the first layer 31 and negative pressure is applied by a vacuum pump. The vacuum process is an optional step of this production method which may increase repeatability and enhance quality control.

When substantially all gas has been evacuated from the liquid material and the space above, the first laminate material 31 is at least partially cured, either through applied heat in the temperature range of 60-140° C., UV light, or any other appropriate method. By leaving the first layer 31 partially cured before moulding of the second laminate layer 32, the two laminate layers 31, 32 will adhere even better to each other. Of course, it is also proposed within the scope of the present invention to fully cure the first layer 31 to achieve a material in solid form and having a Shore A durometer in the range 30-80, preferably 45-65. Advantageously, curing time may be accelerated by applying UV light, or heat by infrared light or passing a heated fluid through the fluid channels 23 of the cooler/absorber 20) or some other method, enabling short production times.

After the curing process of the first layer 31 is completed, the lid is opened and a string 36 of photovoltaic cells 33 is placed on the at least partially cured first layer 31 which now constitutes an electrical insulator for the photovoltaic cells 33. The string 36 is connected at its respective ends to circuit boards protection circuits, connection wires and/or contacts.

At this point, the second layer 32 of the second laminate material is formed on top of the string 36 of photovoltaic cells 33 positioned on the at least partially cured first layer 31 by pouring a polymer material in liquid form onto the photovoltaic cells 33 and the underlying electrical insulation layer 31 until the photovoltaic cells 33 are at least substantially covered. The height of the peripheral edges 22 of the cooler/absorber 20 is adapted to the thickness of the photovoltaic laminate structure 30 such that the liquid second laminate material is also retained in the mould, even under vacuum conditions wherein the fluids may occupy a greater volume as dissolved gases are removed.

Preferably, the dispensing of the liquid second laminate material is carried out by pouring the whole volume of liquid over the string 36 of photovoltaic cells 33 in a rapid movement along the centre line of the photovoltaic cells 33 in a longitudinal direction of the PV/T module 10. This rapid placement of the liquid second laminate material, which may be carried out by means of a robot arm, creates a mound or wall of liquid which flows towards the side edges 22 such that all the air is evacuated towards the side edges 22.

Additional processes may be used such as vacuum, agitation, and mechanical pressure to ensure that all dissolved gases and bubbles in the laminate materials 31, 32 are removed. One important point of this process is to ensure a tight bond between the electrical connections and the laminate which is resistant to moderate relative movement. In one embodiment, this is achieved by wetting one to two centimetres of the sheath of the flexible electrical wire 72 with the second laminate material while the material is being dispensed into the cooler/absorber 10 over the photovoltaic cells 33. This will create a watertight joint 71 around the connection point between the flexible electrical wire 72 and the photovoltaic cells 33, as shown in FIG. 8.

The steps for curing the first laminate material are then repeated by replacing the protective lid over the second layer 32 and applying a negative pressure by means of the vacuum pump. Subsequently, the curing reaction may be accelerated as before by the application of UV light or heat in order to cure the second layer 32 to a material in solid form having a Shore A durometer in the range 30-80, preferably 45-65. Alternatively, heat may be applied by passing a heated liquid through the fluid channels 23 of the cooler/absorber 20.

When the final heating step is completed and the second laminate material in the second layer 32 and the at least partially cured first layer 31 of the first laminate material has been cured, the cooler/absorber 20 including the laminated photovoltaic structure 30 may be moved to the next process step of the manufacturing procedure.

The invention claimed is:

1. A laminated photovoltaic thermal (PV/T) module for a PV/T hybrid solar collector, the PV/T module comprising:
   a cooler/absorber comprising a first flat surface with raised peripheral edges and configured to function as a mould for a first photovoltaic laminate structure, the cooler/absorber having a second flat surface on an opposite side of the first flat surface, the second flat surface being opposite the first flat surface and having raised peripheral edges, the second flat surface being configured to function as a mould for a second photovoltaic laminate structure; and a photovoltaic unit comprising the first photovoltaic laminate structure and the second photovoltaic structure, the first photovoltaic laminate structure and the second photovoltaic laminate structure being identical, the photovoltaic unit including:
- a first layer of a first laminate material moulded on the first flat surface of the cooler/absorber, the first laminate material being electrically insulating and having a high thermal conductivity;
- a plurality of photovoltaic cells positioned on the first layer of the first laminate material;
- a second layer of a second laminate material moulded on and substantially covering the photovoltaic cells, the second laminate material being transparent and having a high heat resistance; and
- the second photovoltaic laminate structure being moulded on the second flat surface of the cooler/absorber.

2. The PV/T module according to claim 1, wherein the photovoltaic cells have a front side and a back side, and wherein the cooler/absorber and the first laminate material comprise a transparent material such that both the front side and the back side of the photovoltaic cells may be illuminated by sunlight.

3. The PV/T module according to claim 1, wherein at least one of the first laminate material and the second laminate material comprise one of siloxane and polyurethane.

4. The PV/T module according to claim 1, further comprising a watertight flexible external electrical connection to the photovoltaic cells having a sheath chemically compatible with the first laminate material.

5. The PV/T module according to claim 1, wherein the photovoltaic cells are arranged in strings and further comprise a bypass diode connected in parallel to each string of the photovoltaic cells and affixed to the collector.

6. The PV/T module according to claim 5, wherein the bypass diodes are moulded into at least one of the first photovoltaic laminate structure and the second photovoltaic laminate structure.

7. The PV/T module according to claim 6, wherein the bypass diodes further comprise DC/DC converters affixed to the collector.

8. The PV/T module according to claim 7, wherein the DC/DC converters are moulded into at least one of the first photovoltaic laminate structure and the second photovoltaic laminate structure.

9. The PV/T module according to claim 5, wherein the strings of the photovoltaic cells are connected in series to form at least one series circuit.

10. The PV/T module according to claim 5, wherein the strings of photovoltaic cells are connected to form at least two series circuits connected in parallel.

11. The PV/T module according to claim 1, wherein the cooler/absorber comprises a plurality of longitudinal fluid channels configured to give an evenly distributed flow of fluid.

12. The PV/T module according to claim 11, wherein the fluid channels have one of a substantially elliptic and substantially circular cross-sectional shape.

13. The PV/T module according to claim 11, wherein the fluid channels comprise one of a honeycomb and rhombic structure on the surface.

14. The PV/T module according to claim 13, wherein the fluid channels are treated with a suitable material to at least one of enhance fluid flow and heat transfer.

15. The PV/T module according to claim 11, further comprising at least one pipe connector having a first distribution section with a plurality of openings configured to be connected to the fluid channels and a second section with an adaptable inlet opening in fluid communication with the first section.

16. The PV/T module according to claim 11, wherein the fluid channels are formed by extrusion of one of a metal alloy and a polymer.

17. The PV/T module according to claim 1, further comprising a transparent convection barrier arranged above the photovoltaic cells.

* * * * *